United States Patent
Langley

(10) Patent No.: US 6,686,295 B2
(45) Date of Patent: *Feb. 3, 2004

(54) ANISOTROPIC ETCH METHOD

(75) Inventor: Rod C. Langley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/219,141

(22) Filed: Aug. 14, 2002

(65) Prior Publication Data

US 2002/0192973 A1 Dec. 19, 2002

Related U.S. Application Data

(62) Division of application No. 09/571,523, filed on May 16, 2000, now Pat. No. 6,461,976, which is a continuation of application No. 08/909,229, filed on Aug. 11, 1997, now Pat. No. 6,133,156, which is a division of application No. 08/603,573, filed on Feb. 20, 1996, now Pat. No. 5,958,801, which is a continuation of application No. 08/194,134, filed on Feb. 8, 1994, now abandoned, which is a division of application No. 07/574,578, filed on Aug. 27, 1990, now Pat. No. 5,201,993, which is a continuation of application No. 07/382,403, filed on Jul. 20, 1989, now Pat. No. 5,271,799.

(51) Int. Cl.$^7$ .............................................. H01L 2/302
(52) U.S. Cl. .................. 438/714; 438/719; 438/723; 438/729; 438/721; 438/725; 438/735
(58) Field of Search .................... 438/714, 719, 438/723, 729, 721, 725, 735

(56) References Cited

U.S. PATENT DOCUMENTS

| | | |
|---|---|---|
| 4,214,946 A | 7/1980 | Forget et al. |
| 4,324,611 A | 4/1982 | Vogel et al. |
| 4,400,865 A | 8/1983 | Goth et al. |
| 4,418,094 A | 11/1983 | See et al. |
| 4,419,201 A | 12/1983 | Levinstein et al. |
| 4,424,102 A | 1/1984 | Brandeis et al. |
| 4,502,915 A | 3/1985 | Carter et al. |
| 4,528,066 A | 7/1985 | Merkling et al. |
| 4,680,086 A | 7/1987 | Thomas et al. |
| 4,818,334 A | 4/1989 | Shwartzman et al. |
| 4,937,643 A | 6/1990 | Deslauriers et al. |
| 4,956,312 A | 9/1990 | Van Laarhoven |
| 4,971,655 A | 11/1990 | Stefano et al. |
| 5,169,487 A | 12/1992 | Langley et al. |
| 5,201,993 A | 4/1993 | Langley |
| 5,271,799 A | 12/1993 | Langley |
| 5,691,246 A | 11/1997 | Becker et al. |
| 5,899,749 A | 5/1999 | Becker et al. |
| 5,958,801 A | 9/1999 | Langley |
| 6,133,156 A | 10/2000 | Langley |
| 6,461,976 B1 * | 10/2002 | Langley ..................... 438/725 |

FOREIGN PATENT DOCUMENTS

| | | |
|---|---|---|
| JP | 56-148833 | 11/1981 |
| JP | 58-122730 | 7/1983 |
| JP | 62-001887 | 1/1987 |

OTHER PUBLICATIONS

Richard S. Muller et al., "Device Electronics for Integrated Circuits," Second Edition, pp. 103–104.
Betty Prince, "Semiconductor Memories," A Handbook of Design, Manufacture, and Application, Second Edition, pp. 125–126.
Truesdale, et al., "The Effect of Added Acetylene on the RF Discharge Chemistry of $C_2F_6$, A Mechanistic Model for Fluorocarbon Plasmas," J. Appl. Physics, vol. 51, No. 5, pp. 2909–2913 (May 1980).

* cited by examiner

*Primary Examiner*—George Goudreau
(74) *Attorney, Agent, or Firm*—TraskBritt

(57) ABSTRACT

A method to anisotropically etch an oxide/silicide/poly sandwich structure on a silicon wafer substrate in situ, that is, using a single parallel plate plasma reactor chamber and a single inert cathode, with a variable gap between cathode and anode. This method has an oxide etch step and a silicide/poly etch step. The fully etched sandwich structure has a vertical profile at or near 90° from horizontal, with no bowing or notching.

9 Claims, 1 Drawing Sheet

ANISOTROPIC ETCH METHOD

CROSS-REFERENCE TO RELATED APPLICATIONS

This application is a divisional of application Ser. No. 09/571,523, filed May 16, 2000, now U.S. Pat. No. 6,461,976, issued Oct. 8, 2002, which is a continuation of application Ser. No. 08/909,229, led Aug. 11, 1997, now U.S. Pat. No. 6,133,156, issued Oct. 17, 2000, which is a divisional of application Ser. No. 08/603,573, filed Feb. 20, 1996, now U.S. Pat. No. 5,958,801 is issued Sep. 28, 1999, which is a continuation of application Ser. No. 08/194,134, led Feb. 8, 1994, abandoned, which is a divisional of application Ser. No. 07/574,578, led Aug. 27, 1990, now U.S. Pat. No. 5,201,993, issued Apr. 13, 1993, which is a continuation of application Ser. No. 07/382,403, filed Jul. 20, 1989, now U.S. Pat. No. 5,271,799, issued Dec. 21, 1993.

BACKGROUND OF THE INVENTION

1. Field of the Invention

The present invention relates to etching methods used in the fabrication of integrated electronic circuits on a semiconductor substrate such as silicon, particularly a single-chamber/single-cathode (in situ) method of anisotropically plasma etching a sandwich structure of an oxide, tungsten silicide, and polycrystalline silicon, or equivalent structure.

An electronic circuit is chemically and physically integrated into a substrate such as a silicon wafer by patterning regions in the substrate, and by patterning layers on the substrate. These regions and layers can be conductive, for conductor and resistor fabrication, or insulative, for insulator and capacitor fabrication. They can also be of differing conductivity types, which is essential for transistor and diode fabrication. Degrees of resistance, capacitance, and conductivity are controllable, as are the physical dimensions and locations of the patterned regions and layers, making circuit integration possible. Fabrication can be quite complex and time consuming, and therefore expensive. It is thus a continuing quest of those in the semiconductor fabrication business to reduce fabrication times and costs of such devices in order to increase profits. Any simplified processing step or combination of processes at a single step becomes a competitive advantage.

2. State of the Art

A situation where a process simplification is desirable is in the anisotropic etch of a layer of oxide on a layer of silicide on a layer of poly (also called an oxide/silicide/poly sandwich structure). In this disclosure, "oxide" denotes an oxide of silicon, "silicide" is short for tungsten silicide, and other commonly known silicides such as tantalum silicide, molybdenum silicide, and titanium silicide, and "poly" is shoptalk for polycrystalline silicon. "Polycide" denotes a silicide-over-poly combination. Oxide is an insulator with dielectric properties. Poly is resistive in nature, but is made less resistive when doped with an element having less or more than four valence electrons, or when layered with conductive silicide.

An oxide/silicide/poly sandwich structure presents a difficult etching task, particularly with an additional mask layer of photoresist ("resist"), which must be the case if patterning is desired. The difficulty is due to the distinct differences in the way oxide and polycide are etched, particularly with resist still present on top of the structure.

Both oxide and polycide can be etched using a parallel plate plasma reactor. However, an oxide is typically etched in fluorine-deficient fluorocarbon-based plasmas, whereas silicide and poly can be etched in fluorine- or chlorine-based discharges. Reactor cathode materials may also differ: for oxide etch, an erodible cathode such as graphite or silicon is often used to provide a source of carbon or silicon for etch selectivity, whereas for polycide etch, an inert cathode is preferred, especially when utilizing chlorine gas ($Cl_2$) for selectivity. If a single-chamber process were attempted using conventional art to etch an oxide/silicide/poly sandwich structure, the erodible cathode required for oxide etch would be destroyed by the chlorine required for polycide etch. Using conventional methods, the two steps are incompatible.

Oxide etch in general is fairly well understood given a universal need for a vertical profile. This vertical profile is realized primarily by ion induced reaction with the oxide, coupled with normal incidence of the ions on the oxide surface. The amount and energy of these ions are primarily controlled by the reactor's rf power and gap. Generally, a fluorocarbon-based gas mixture is introduced at a low pressure into the etch chamber. The exact gas composition is chosen, and an erodible cathode is used to scavenge excessive fluorine radicals so that the fluorine-to-carbon ratio is near, but not beyond, the so-called polymerization point. Under these conditions, when a plasma is ignited, the fluorocarbons are dissociated and release fluorine radicals and $CF_x$ species. Although fluorine radicals etch oxide, they do so very slowly: the primary etchant for oxide is considered to be the $CF_x$ species. Some of these species diffuse to the oxide surface where, with the assistance of ion bombardment, they react with the oxide and release volatile byproducts $SiF_4$, $CO$, and $CO_2$. In addition, some of the $CF_x$ species react with each other to form fluorocarbon polymers. Polymer that forms on horizontal surfaces is removed by vertical ion bombardment. Polymer that forms on vertical sidewalls is not significantly degraded by the bombardment, and actually serves a useful purpose by protecting the sidewalls from attack by the etchant species. This sidewall protection enables the achievement of vertical profiles, adjustable by varying the fluorine-to-carbon ratio. As the cathode is eroded, the quantity of available fluorine radicals is reduced. Therefore, a polymer-producing gas such as $CHF_3$ is balanced against a fluorine-producing gas such as $CF_4$ to provide proper selectivity, with assistance to sidewall protection.

Two methods are presently used to etch an oxide/silicide/poly sandwich structure. Both methods use separate reactors: one for oxide etch and one for polycide etch. The first method involves etching the oxide in an oxide etch reactor, using an erodible cathode. After oxide etch, the resist is removed from the wafer. Silicide and poly are then etched in a poly etch reactor, using an inert cathode. Both etches are anisotropic.

The second method uses the same principles as the first, except that there are two reactors in one machine. The two reactors are configured as separate oxide and polycide reactors having a common vacuum transfer area, so that a wafer can be transferred in a vacuum from the oxide reactor to the polycide reactor, thus minimizing additional handling. The resist is generally not removed prior to polycide etch in this method. This is sometimes referred to as "in situ" since the wafers never leave the vacuum of one machine. However, they are etched in two different etch chambers and are not truly in situ in the sense of this disclosure.

It would be of great advantage to etch oxide and polycide truly "in situ," that is, in one reactor chamber, with a single cathode.

BRIEF SUMMARY OF THE INVENTION

An object of the present invention is to provide a method of anisotropically etching an oxide/silicide/poly sandwich structure in situ. Other objects of the invention are a fast processing time, an improved process yield and cleanliness.

In summary, the inventive process is as follows. A wafer having the sandwich structure described above, coated with a mask layer of resist, is transferred into the chamber of a parallel plate plasma reactor, having an anodized aluminum cathode and a variable gap, for two steps: oxide etch and polycide etch. In the oxide etch step, oxide not protected by resist is exposed to a plasma of about 1.9 W/cm$^2$ power density at a 0.48 cm gap, in a 2.3 torr atmosphere of 50 sccm $C_2F_6$, 100 sccm He, 40 sccm $CF_4$, and 32 sccm $CHF_3$. Immediately after the oxide etch step, in the same chamber and using the same cathode, silicide and poly layers are etched in a plasma of about 0.57 W/cm$^2$ at a 1.0 cm gap in a 0.325 torr atmosphere of 90 sccm $Cl_2$ and 70 sccm He. The finished structure has a vertical profile at or near 90° from horizontal, with no bowing or notching. The entire inventive process takes about 3 minutes.

DETAILED DESCRIPTION OF THE INVENTION

Figure 1:
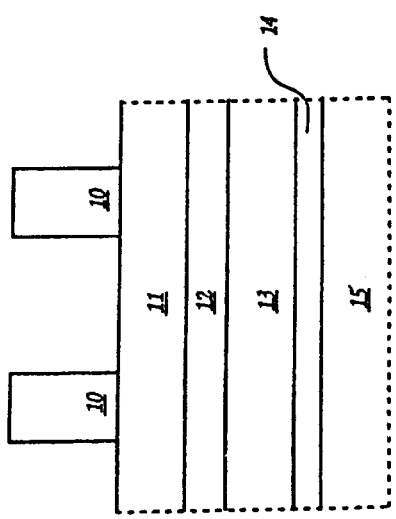
FIG. 1 shows a cross-sectioned oxide/silicide/poly sandwich structure with a patterned resist mask layer, prior to the inventive etch.

As illustrated in FIG. 1, a photoresist mask layer 10 is aligned and developed on a sandwich structure of oxide 11, silicide 12, and poly 13 on gate oxide 14 of a silicon wafer substrate 15. Fabrication and damasking of this structure are done by methods well known to those skilled in semiconductor design and processing, and hence are not fully disclosed herein. The preferred embodiment of the inventive method is well suited to etch a 3,000 angstrom layer 11 of TEOS oxide (an oxide of silicon, derived from tetraethylorthosilicate) on 1,200 angstroms of tungsten silicide 12 on 3,000 angstroms of poly 13.

Figure 2:
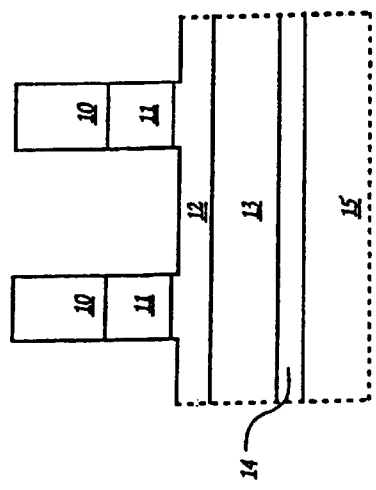
FIG. 2 shows a cross-section of said structure after oxide etch.

The wafer having the masked structure is transferred into the chamber of a Lam 790 parallel plate plasma reactor, having an anodized aluminum cathode, a variable gap, and a 13.56 MHz rf power plasma generator for an inventive process having two steps: oxide etch and polycide etch. In the oxide etch step, oxide 11 not protected by photoresist mask layer 10 is exposed to a plasma of about 1.9 W/cm$^2$ power density at a 0.48 cm gap, in a 2.3 torr atmosphere of 50 sccm $C_2F_6$, 100 sccm He, 40 sccm $CF_4$, and 32 sccm $CHF_3$. In this disclosure, "sccm" denotes standard cubic centimeters per minute, and "gap" refers to the distance between plasma electrodes, one of which supports the wafer. After the oxide etch step, which takes under a minute, the structure appears as shown in FIG. 2.

Figure 3:
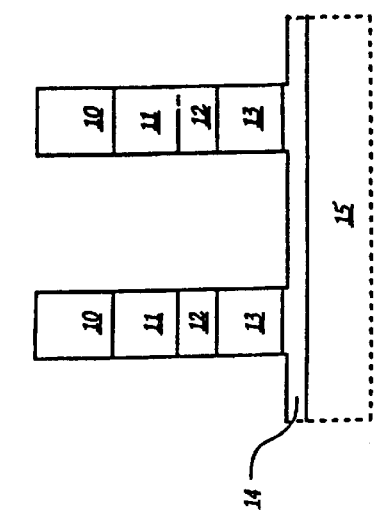
FIG. 3 shows a cross-section of said structure after polycide etch.

Immediately after the oxide etch step, in the same chamber and using the same cathode, silicide and poly layers 12 and 13 are etched in a plasma of about 0.57 W/cm$^2$ at a 1.0 cm gap in a 0.325 torr atmosphere of 90 sccm $Cl_2$ and 70 sccm He. This etch takes a little over 2 minutes, with the entire inventive process taking about 3 minutes. The finished structure appears as shown in FIG. 3, with a profile at or near 90° from horizontal, with no bowing or notching.

Details of the oxide etch step are now provided. Although preferred parameter values are stated above, plasma power density can range within about 0.18–4.0 W/cm$^2$, the gap can vary within about 0.3–0.6 cm, 0.38–0.52 cm being the preferred range, and the pressure can range within about 1.8–3.0 torr, although 2.2–2.4 torr is preferred. Gas quantities may vary, as long as at least about 5 sccm He is provided. Providing more $CF_4$ than $CHF_3$ makes a cleaner process, but this ratio can be varied if desired.

The inventive process uses a non-erodible anodized aluminum cathode, which increases the amount of available fluorine radicals. According to conventional thought, in order to maintain the same oxide-to-polycide selectivity as the prior art, the ratio of $CF_4$ to $CHF_3$ must be decreased to minimize fluorine radicals. It was found that this approach does not provide adequate selectivity without an excessive and quick buildup of polymer. This was solved by adding $C_2F_6$ to the chamber atmosphere as the predominant gas, which provides more $CF_x$ species and relatively few fluorine radicals, resulting in acceptable selectivity without excessive polymer buildup. $C_2F_6$ also resolves a "micromasking" problem, in which areas of underlying polycide were not being etched. Although the cause is unclear, it is speculated that the $CF_x$ species reacted with the tungsten silicide, forming a polymer layer which interfered with subsequent polycide etching. $C_2F_6$ evidently produces a polymer without this affinity for tungsten silicide, thereby eliminating micromasking.

The inventive process includes a high pressure atmosphere in order to produce a faster oxide etch rate. High pressure results in a higher fluorine radical flux on the oxide surface. When combined with high rf power, the etch rate is increased. High pressure and rf power do have drawbacks, however. Although rf induced ion bombardment assists in oxide etch, it also contributes to photoresist erosion, which is undesirable. Further, if rf power is too high, the resist will "burn" or reticulate. Higher pressure makes a thicker atmosphere, scattering ions and gas radicals in the plasma, resulting in more sidewall etching than with a low pressure system.

The oxide etch step of the inventive method includes an overetch of about 45 seconds to fully clear all residual oxide. Although the $C_2F_6/CF_4/CHF_3$ gas mixture etches underlying polycide during overetch, the etch continues to be anisotropic because of the sidewall passivation provided by the halocarbon-derived polymer and from the carbon introduced by eroding resist. After oxide has been cleared, the polycide-to-resist etch rate ratio is approximately 1.8:1.

Polycide etch step details are now provided. Although preferred parameter values have been stated, plasma power density can range within about 0.18–2.0 W/cm$^2$, the gap can vary within about 0.5–2.5 cm, 0.8–1.5 cm being the preferred range, and the pressure can range within about 0.200–0.550 torr, although about 0.300–0.425 torr is preferred. Quantities of the gases may vary, as long as at least about 50 sccm He is provided. It is contemplated that $SiCl_4$ or $BCl_3$ or a combination thereof might be used to provide additional $Cl_2$, if desired.

The lower pressure of the polycide etch allows for more ion bombardment, which, with resist erosion and the $Cl_2$ concentration, determines the etch rate and profile of tile silicide and poly layers 12 and 13. $Cl_2$ provides the necessary selectivity to the polycide, so that minimal underlying gate oxide 14 is etched. Fluorine can also be used, but $Cl_2$ is preferred because it provides superior selectivity. The resist used must therefore be able to reasonably withstand a chlorine-based plasma. The preferred embodiment utilizes Hunt's 6512 resist, developed with Hunt's photoresist developer 428. It is realized that other resists, developers, and mask layer compositions can be used as well.

An additional benefit of the inventive method is the ability to use carbon generated by the resist to help passivate polycide sidewalls, which means that carbon-containing gases do not have to be added to the gas mixture during polycide etch.

There is an upper rf power limit that can be safely used before the poly-to-gate oxide selectivity is reduced to the point where the poly cannot be completely etched without removing all of the exposed gate oxide. The inventive process provides a selectivity of approximately 13:1. Variations in the chlorine flow and total pressure do not significantly change this selectivity, although an increase in rf power reduces it.

In both of the inventive steps, helium is added to improve etch uniformity. The pressure, power, and various gas quantities are balanced to produce the fastest etch rates while preserving selectivity.

Clearly, in view of the above disclosure, other embodiments of this invention will present themselves to those of ordinary skill in semiconductor processing, such as applying the invention to other kinds of masking layers, oxide, silicide, such as tungsten silicide, tantalum silicide, molybdenum silicide, and titanium silicide, and poly, and varying thickness and doping of each layer etched. Since the inventive process includes one step for polycide etch, a simple oxide/poly structure can be etched instead of an oxide/silicide/poly structure, without materially altering the process. It is also conceivable that plasma power density and gap may be varied, gas quantities adjusted, similar gases substituted, or some other inert material used for the cathode, to achieve the same or similar results. Gas quantities may also be changed while preserving essentially similar ratios of one gas to another. Another make of reactor might also be chosen. These variations and others are intended to be circumscribed by these claims.

What is claimed is:

1. A method to anisotropically etch at least one layer in a group of layers consisting of a silicide layer, a polycrystalline silicon layer, and a polycide layer located over a layer of gate oxide on a substrate, said anisotropic etching producing a profile at or near 90° from horizontal in a parallel plate plasma etch reactor having a first electrode and an inert second electrode comprised of anodized aluminum, said method comprising:

providing a gap of approximately 1.0 cm between said first electrode and said inert second electrode;

mounting said substrate on said first electrode;

providing a plasma atmosphere within said parallel plate plasma etch reactor, said plasma atmosphere including a pre sure of approximately 0.325 torr, $Cl_2$ at a rate of approximately 90 sccm, H at a rate of approximately 70 sccm, and a plasma power density of approximately 0.57 W/cm$^2$; and anisotropically etching said at leas one layer in said group of layers consisting of a silicide layer, a polycrystalline silicon layer, and a polycide layer located over said layer of gate oxide.

2. A method to anisotropically etch at least one layer in a group of layers consisting of a silicide layer a polycrystalline silicon layer, and a polycide layer located over a layer of gate oxide on a substrate, said anisotropical etch producing a profile at or near 90° from horizontal with respect to said substrate in a parallel plate plasma etch reactor having a first electrode and an inert second electrode comprised of anodized aluminum, said first electrode and said inert second electrode having gap therebetween, said method comprising:

providing a gap within the range of approximately 0.5 cm to 2.5 cm;

mounting said substrate on said first electrode; and providing a plasma atmosphere within said parallel plate plasma etch reactor including $Cl_2$ and He, a pressure within the range of approximately 0.200 to 0.550 torr, and a plasma power density within the range of approximately 0.18 to 2.0 W/cm$^2$; and anisotropically etching said at leas one layer in said group of layers consisting of said silicide layer, said polycrystalline silicon layer, and said polycide layer located over said layer of gate oxide.

3. A method to anisotropically etch at least one layer in a group of layers consisting of a silicide layer, a polycrystalline silicon layer, and a polycide layer located on a portion of a substrate, said anisotropical etch producing a profile at or near 90° from horizontal with respect to said substrate using a parallel plate plasma etch reactor including a first electrode and an inert second electrode comprised of anodized aluminum, said first electrode and said inert second electrode having a gap therebetween, said method comprising:

providing a gap within the range of approximately 0.8 cm to 1.5 cm;

mounting said substrate on said first electrode; and providing a plasma atmosphere w thin said parallel plate plasma etch reactor including $Cl_2$ and He, a pressure within the range of approximately 0.300 torr to 0.425 torr, and a plasma power density within the range of approximately 0.18 W/cm$^2$ to 2.0 W/cm$^2$ to anisotropically etch said a least one layer in said group of layers comprising said silicide layer, said polycrystalline silicon layer, and said polycide layer located on said portion of said substrate.

4. A method to anisotropically etch a structure in situ to produce a profile at or near 90° from horizontal with respect to said structure, said structure including a first layer of an oxide of silicon on a second layer selected from the group consisting of silicide, polycrystalline silicon, and polycide, said structure located on a substrate, said anisotropic etch comprising using a parallel plate plasma etch reactor including a first electrode and an inert second electrode comprised of anodized a aluminum, said first electrode and said inert second electrode having a gap therebetween, said method comprising:

placing said substrate on said first electrode;

providing a first high pressure at sphere within said parallel plate plasma etch reactor, said first high pressure atmosphere including $C_2F_6$, $CHF_3$, $CF_4$, and He;

exposing said first layer to a first plasma having a first high power density to expose at least a portion of said second lay overetching said first layer to substantially remove said oxide of silicon;

providing a second high pressure atmosphere within said parallel plate plasma etch reactor including $Cl_2$ and He; and exposing said second layer to a second plasma having a second high power density.

5. The method of claim 4, wherein:

said first high pressure atmosphere includes a pressure of approximately 2.3 torr, $C_2F_6$ at a rate of approximately 50 sccm, $CHF_3$ at a rate of approximately 32 sccm, $CF_4$ at a rate of approximately 40 sccm, a d He at a rate of approximately 100 sccm;

said first plasma includes a first high power density of approximately 1.9 W/cm$^2$;

a gap of approximately 0.48 cm exists between said first electrode and said inert second electrode for said first high power density;

said second high pressure atmosphere includes a pressure of approximately 0.325 torr, $Cl_2$ at a rate of approximately 90 s cm and He at a rate of approximately 70 sccm;

said second plasma includes a second high power density of approximately 0.57 W/cm$^2$; and a gap of approximately 1.0 cm exists between said first electrode and said inert second electrode for said second high power density.

6. The method of claim 4, wherein:

said first high pressure atmosphere includes a pressure within a range of approximately 1.8 torr to 3.0 torr;

said first plasma includes a first hi h power density within a range of approximately 0.18 to 4.0 W/cm$^2$;

a gap within a range of approximately 0.3 to 0.6 cm exists between said first electrode and said inert second electrode for aid first high power density;

said second high pressure atmosphere includes a pressure within a range of approximately 0.200 torr to 0.550 torr;

said second plasma includes a second high power density within a range of approximately 0.18 to 2.0 W/cm$^2$; and a gap within approximately 0.5 to 2.5 cm exists between said first electrode and said inert second electrode for said second high power density.

7. The method of claim 4, wherein:

said first high pressure atmosphere includes a pressure within a range of approximately 2.2 torr to 2.4 torr;

said first plasma includes a first high power density within a range of approximately 0.18 to 4.0 W/cm$^2$;

a gap within approximately 0.38 t 0.52 cm exists between said first electrode and said inert second electrode for said first high power density;

said second high pressure atmosphere includes a pressure within a range of approximately 0.300 torr to 0.425 torr;

said second plasma includes a second high power density within a range of approximately 0.18 to 2.0 W/cm$^2$; and a gap within approximately 0.8 t 1.5 cm exists between said first electrode and said inert second electrode for said second high power density.

8. The method of claim 4, wherein:

said first high pressure atmosphere includes more $C_2F_6$ than $CF_4$ and more $CF_4$ than $CHF_3$;

said first high pressure atmosphere includes at least approximately 5 sccm He; and said second high pressure atmosphere includes He at a rate of at least approximately 50 sccm.

9. The method of claim 4, wherein the structure includes a mask layer that releases carbon when subjected to a plasma and resists chlorine.

* * * * *

UNITED STATES PATENT AND TRADEMARK OFFICE
CERTIFICATE OF CORRECTION

PATENT NO. : 6,686,295 B2
DATED : February 3, 2004
INVENTOR(S) : Rod C. Langley

It is certified that error appears in the above-identified patent and that said Letters Patent is hereby corrected as shown below:

Column 1,
Line 50, after the second occurrence of "silicide" delete ","

Column 5,
Line 56, change "pre sure" to -- pressure --
Line 57, change "H" to -- He --
Line 60, change "leas" to -- least --

Column 6,
Line 6, change "having gap" to -- having a gap --
Line 15, change "leas" to -- least --
Lines 32, change "w thin" to -- within --
Line 53, change "at sphere" to -- atmosphere --
Line 58, change "lay" to -- layer; --

Column 7,
Line 5, change "a d" to -- and --
Line 8, change "1.9W/cm$^2$;" to -- 1.9 W/cm$^2$; --
Line 14, change "90 s cm" to -- 90 sccm --
Line 24, change "hi h" to -- high --

Column 8,
Line 17, change "0.8 t 1.5 cm" to -- 0.8 to 1.5 cm --

Signed and Sealed this

Twenty-eighth Day of December, 2004

JON W. DUDAS
*Director of the United States Patent and Trademark Office*